United States Patent [19]

Schaaf et al.

[11] Patent Number: 5,202,640

[45] Date of Patent: Apr. 13, 1993

[54] CAPACITANCE AND LEAKAGE TEST METHOD AND APPARATUS

[75] Inventors: Robert L. Schaaf, Vestal, N.Y.; Floyd W. Olsen, Athens, Pa.; Edward J. Tasillo, Newark Valley, N.Y.

[73] Assignee: International Business Machines Corporation, Armonk, N.Y.

[21] Appl. No.: 709,476

[22] Filed: Jun. 3, 1991

[51] Int. Cl.[5] .......................................... G01R 27/26
[52] U.S. Cl. .................. 324/537; 324/158 F; 324/678
[58] Field of Search ............. 324/537, 158 F, 523, 324/658, 678, 548

[56] References Cited

U.S. PATENT DOCUMENTS

| | | |
|---|---|---|
| 3,460,032 | 8/1969 | Bennent. |
| 3,652,929 | 3/1972 | Cushman ............................ 324/548 |
| 3,824,459 | 7/1974 | Uchida ................................ 324/60 |
| 3,855,527 | 12/1974 | Masopust ........................... 324/60 |
| 3,975,680 | 8/1976 | Webb .................................. 324/61 |
| 4,103,225 | 7/1978 | Stephens ............................ 324/60 |
| 4,320,338 | 3/1982 | Morris ................................ 324/60 |
| 4,342,959 | 8/1982 | Skilling ........................... 324/158 T |
| 4,558,274 | 12/1985 | Carusillo ........................... 324/60 |
| 4,565,966 | 1/1986 | Burr .................................... 324/73 |
| 4,748,401 | 5/1988 | Aldinger ............................ 324/61 |
| 4,775,830 | 10/1988 | Lyyra ................................. 324/61 |
| 4,795,966 | 1/1989 | Cook .................................. 324/60 |
| 4,841,240 | 6/1989 | Hsue et al. ....................... 324/537 |
| 4,906,939 | 3/1990 | Berrigan ......................... 324/158 F |
| 5,059,897 | 10/1991 | Aton et al. ...................... 324/537 |
| 5,059,911 | 10/1991 | Huber ............................... 324/523 |

OTHER PUBLICATIONS

PCT WO 90/02340 International Application Published Under The Patent Cooperation Treaty, Mar. 8, 1990.
Bare Board Testing by William M. Hastie in Circuits Mfg. Magazine, Jan. 1982, pp. 36-48.
IBM Technical Disclosure Bulletin, vol. 24, No. 11B, Apr. 1982, pp. 5943-5944.

Primary Examiner—Jack B. Harvey
Assistant Examiner—Maura K. Regan
Attorney, Agent, or Firm—William H. Steinberg

[57] ABSTRACT

Capacitance is measured using a system including a high voltage ramp monitor. A signal net is connected to ground by probes while a constant charging current is applied to the internal planes. A pure capacitive net will have a linear voltage rise proportional to capacitance, therefore its capacitance can be represented by ramp time. Leakage shorts will be detected by residual charge current measurements. The stimulus voltage is maintained for a fixed time after ramping to provide net to internal plane stress testing. Measured net capacitance is compared to nominal net capacitance for short/open detection.

24 Claims, 9 Drawing Sheets

CAPACITANCE AND LEAKAGE TEST METHOD AND APPARATUS

BACKGROUND OF THE INVENTION

The present invention relates to a test method and apparatus for measuring capacitance and leakage current and more particularly relates to apparatus useful in finding isolated net shorts, opens, and leakage in unpopulated multilayer boards or substrates with voltage and ground reference planes.

Testing of unpopulated multilayer boards and substrates for shorts and opens in signal paths results in improved product reliability. A short is an electrical continuity where it is not desired often caused by excessive copper between two circuit lines after etching. An open is a break in a circuit line preventing circuit continuity. Typically, testing is done with a "bed-of-nails" test fixture. The nails are probes typically spaced 0.100 inches apart which make contact electrically between the tester and the points of contact on the board being tested. It is highly desirable to contact all test points at once to avoid step and repeat operations. The difficulty with the bed-of-nails approach are problems with the probe heads which present design, manufacture, and maintenance challenges and particularly with the decreasing size of surface features and grid spacings on boards being produced. Construction of a bed-of-nails test head for each of the different types of boards and substrates to be checked involves a high cost and long fabrication time.

An alternative to the bed-of-nails approach for testing for shorts and opens is to measure the net capacitance relative to an internal or external reference plane.

Measurements are typically done with an AC capacitance meter applying a low voltage/high frequency test stimulus. The capacitive response decreases as the series resistance increases thus limiting the ability to detect leakage paths.

It is an object of the present invention to provide a capacitance and leakage test apparatus which performs a voltage stress test while measuring capacitance.

It is another object of the present invention to provide a capacitance and leakage test apparatus which provides extended leakage response beyond the range of conventional sine wave capacitance meters.

It is a further object of the present invention to provide a capacitance and leakage test apparatus which will detect high resistance leakage paths between nets while measuring capacitance.

It is a still further object of the present invention to provide a capacitance and leakage test apparatus which will detect too-closely spaced signal nets while measuring capacitance.

SUMMARY OF THE INVENTION

One aspect of this invention, is apparatus for checking a net on a circuit board or substrate separated by a dielectric from a plane of electrically conductive material. The apparatus has a current source for supplying a current, to the plane, and grounding means connected to the net being checked or vice versa, for ramping up and maintaining a voltage therebetween. Means for measuring the voltage between the net being checked and the plane is provided as is means for measuring the time required for the voltage across the plane and net being checked to increase a predetermined amount when charged by the current source. Also provided is means for limiting the voltage across the plane and net being checked to a predetermined limit value. Means for monitoring the current supplied by the current source to the plane for maintaining the voltage at the predetermined limit value, allows determination of leakage to another net when a current is detected.

BRIEF DESCRIPTION OF THE DRAWING

The subject matter which is regarded as the invention is particularly pointed out and distinctly claimed in the concluding portion of the specification. The invention, however, both as to organization and method of practice, together with further objects and advantages thereof, may be best understood by reference to the following description taken in conjunction with the accompanying drawing figures.

DETAILED DESCRIPTION OF THE PREFERRED EMBODIMENT

Figure 1:
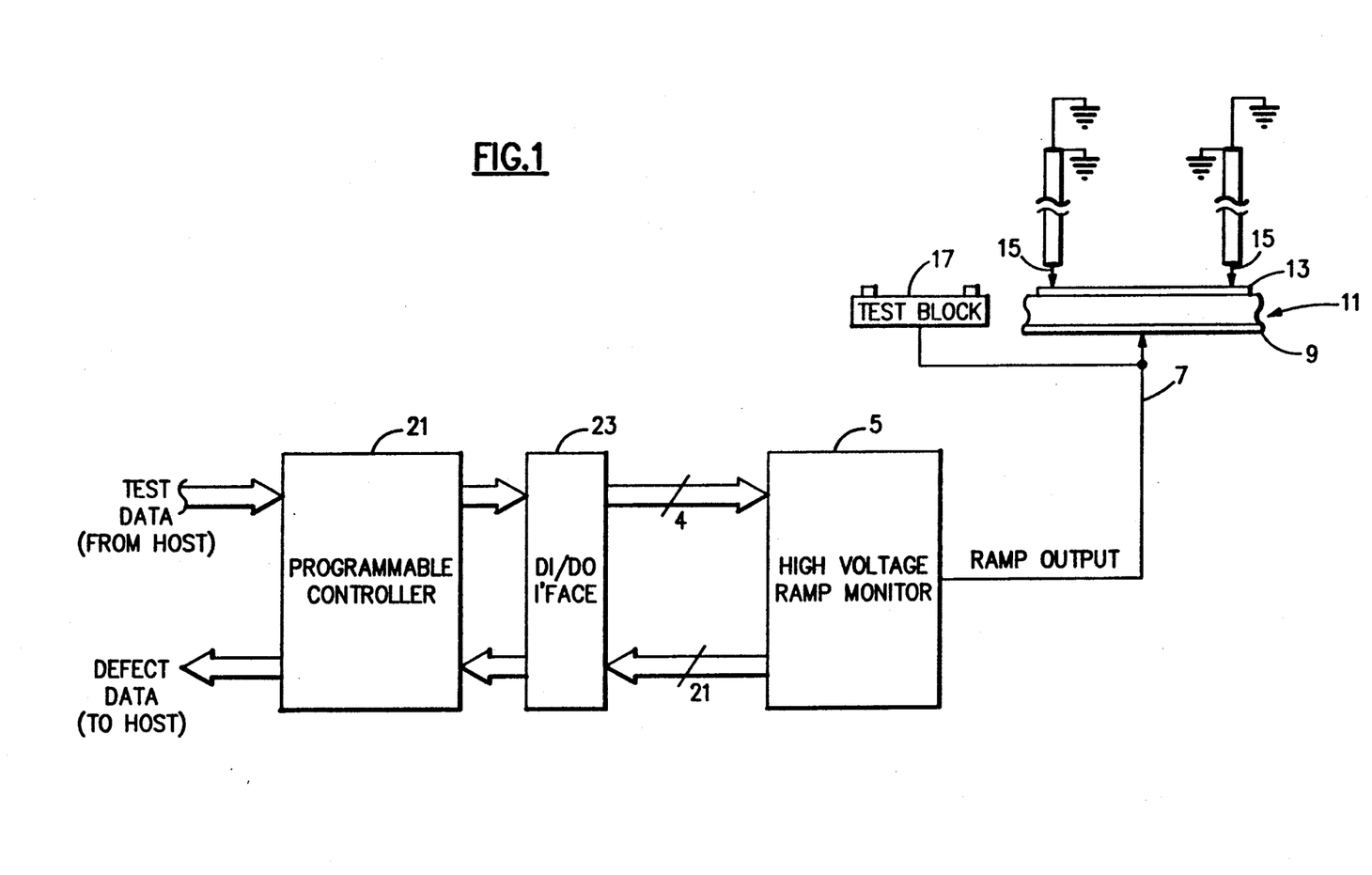
FIG. 1 is a block diagram showing a system including a high voltage ramp monitor for measuring capacitance and detecting leakage on an unpopulated board or substrate.

Referring now to the drawing and particularly FIG. 1 thereof, a block diagram of apparatus for measuring capacitance and leakage current is shown. A high voltage ramp monitor 5 provides a constant charging current through a fixed probe 7 to the shorted-together power and ground planes 9 of a multilayer unpopulated device 11 which can be a substrate or a printed circuit board. Alternatively, the net can be charged and the shorted together power and ground planes grounded. If the unpopulated device doesn't have a power or ground plane, the constant charging current can be provided to a separate conductive planar sheet and the device placed in close proximity thereto. Applying ramp voltage to a reference plane allows stationary circuitry with minimum distributed capacitance. A net 13 or isolated conductive path being checked on the substrate or printed circuit board has either one end or both ends shorted by moveable probes 15 which can be part of a two-point robotic handler (not shown). A test block 17 is provided to allow for compensation of the distributed capacitance of the test system, to provide a scaling factor for capacitance measurements, and to simulate resistive shorts and leakage paths.

The high voltage ramp monitor 5 is connected to a programmable controller 21 by means of a digital input digital output interface (DI/DO) 23. There are four digital output interface lines connected from the DI/DO interface to the high voltage ramp monitor 5 providing ramp voltage select, dwell select, counter select, and test enable signals. There are twenty-one digital input lines provided from the high voltage ramp monitor to the DI/DO interface. The twenty-one lines include seventeen data bus lines (16 plus a parity line), a 5% ramp level line, 5% ramp latch line, a 90% ramp latch line, and a high voltage ramp monitor relay line.

The programmable controller 21, which can comprise a personal computer is connected to a host computer (not shown) for receiving test data and sending defect data thereto.

High Voltage Ramp Monitor

Figure 2:
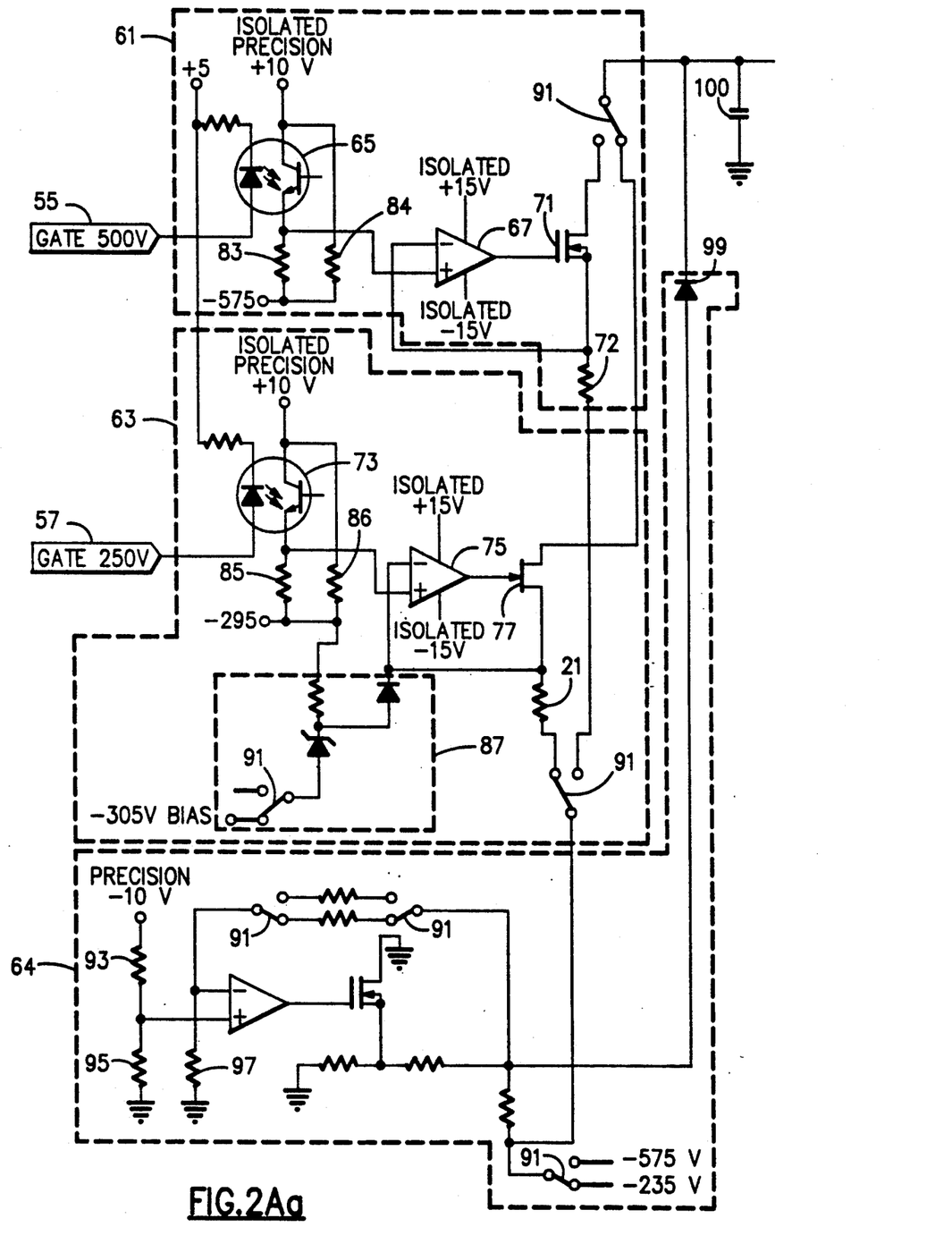
Figures 2, 2A:
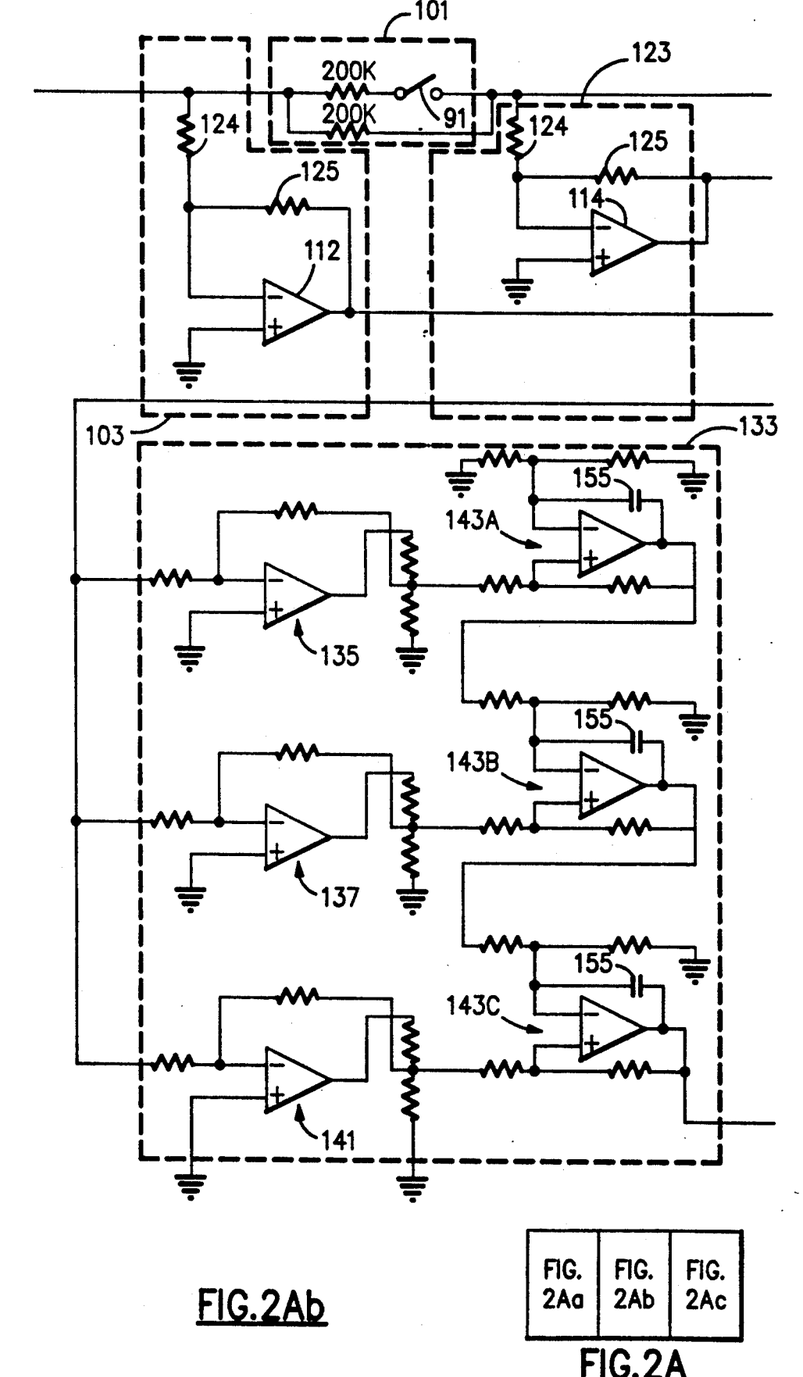
FIG. 2A, 2Aa, 2Ab, 2Ac and 2B, 2Ba, 2Bb are schematic diagrams of the analog and digital circuits of the high voltage ramp monitor.
Figure 2B:
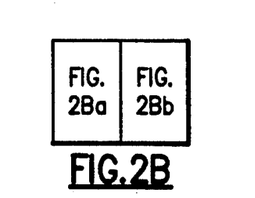

Referring now to FIGS. 2A and 2B, the high voltage ramp monitor 5 is shown in more detail, with the analog portion shown in FIG. 2A and the digital portion shown in FIG. 2B. In FIG. 2B, the test enable signal line 25 from the DI/DO interface is connected to the clock input of a test enable latch 27. Each of the latches shown in FIG. 2B has a gate input, a clock input, and a reset input, as well as Q and $\overline{Q}$ output. When the reset input line is high, the $\overline{Q}$ output is high and the Q output line is low. A positive going edge at the clock input, triggers the clock transferring the information at the gate input. When the gate input is high and a positive going edge is received at the clock input, the output Q is high and the output $\overline{Q}$ is low. Any further pulses at the clock input will not retrigger the latch. The registers shown in FIG. 2B function as a group of latches.

The test enable signal line 25 is also connected through an inverter 31 to the reset input of a 90% latch 33, the reset input of a 5% latch 35, the reset input of a leakage enable latch 215, and the reset input of a 16 bit and a 15 bit counter 161 and 200, respectively. The $\overline{Q}$ output of the test enable latch 27 is connected to the gate input of the latch. The test enable signal line 25 transitioning high causes the reset line of the latch to go low. When the reset input is no longer held high the latch is not in the reset condition and the latch can change state. The test enable signal line provides a positive going edge to the clock input of the test enable latch which causes the high input at the gate provided by the $\overline{Q}$ output to cause the latch to change states, with the Q output transitioning high.

The Q output of latch 27 is connected to one input of each of two, three input AND gates 45 and 47. The 90% latch 33 is no longer held in the reset state when the test enable signal becomes active. Since the clock input to the latch does not change when the test enable goes high, the latch remains in the reset state. The $\overline{Q}$ output of the latch 33 is connected to one of the inputs of a three input OR gate 51. The output of the OR gate is connected to an input on each of the AND gates 45 and 47.

The ramp voltage select line 51 from the DI/DO interface 23 is connected to one input of AND gate 45 and inverted in inverter 53 and connected to one input of AND gate 47. The ramp voltage select line 51 from the DI/DO interface when high and when the test enable signal line 25 is high, causes a gate 500 volt signal line 55 provided at the output of AND gate 45 to be high. When the ramp voltage select line 51 is low and the test enable signal line is high, a gate 250 volt signal line 57 provided at the output of AND gate 47 is high.

Referring now to FIG. 3A, the gate 500 volt signal line 55 is connected to a 500 volt ramp generator circuit and the gate 250 volt signal line 57 is connected to a 250 volt ramp generator circuit. The 250 volt and 500 volt ramp generator circuits each have two portions, a constant current source portion and a voltage regulator portion. The constant current source portion of the 500 volt ramp generator 61 receives the gate signal at an LED/phototransistor 65 which provides an optically isolated input. The LED/phototransistor provides a fixed voltage to the noninverting terminal of an operational amplifier 67. The output of the operational amplifier is connected to the gate of an FET 71. Current flowing through the drain and source of FET 71 also flows through a sense resistor 72. The voltage across the resistor is connected to the inverting input of the operational amplifier 67. Operational amplifier 67, FET 71, and feedback resistor 72 serve as a constant current source. The constant current source portion of the 250 volt ramp generator circuit has an LED/phototransistor 73, an operational amplifier 75, an FET 77, and a sense resistor 81 connected and operating as described in connection with the 500 volt constant current source portion of the 500 volt ramp generator. The power supplies used with the operational amplifiers 67 and 75 are isolated low voltage power supplies. The isolated low voltage power supplies voltages which are measured relative to either −575 V or −295 V depending on whether the 500 volt or 250 volt gate signal is high, respectively. Resistors 83, 84, 85, and 86 controlling the voltage to the noninverting input terminals of the operational amplifiers 67 and 75, respectively, have 5% tolerances. The resistors 72 and 81 which determine the feedback voltage supplied to the inverting input of the operational amplifier have 0.1% tolerances. Bias circuit 87 connected to the source of FET 77 provides a bias current through the FET to reduce the Miller effect during turn on when the gate voltage is increased.

The 500 volt ramp generator circuit has an enhancement mode N channel FET 71 and the 250 volt ramp generator circuit has an N channel depletion mode FET 77 to provide the best parameters at the voltages required including low capacitance. Both FET 71 and 77 are operated at voltages great enough to avoid capacitance effects between the terminals of the MOSFET and between the terminals of the JFET that occur near saturation of the devices. The drain and source of the FET devices are kept at a voltage at least 10% of the full rated drain voltage and preferably 15% or more. In the present embodiment the voltage between the drain and source of FET 71 is greater than 75 volts. The voltage between the drain and source of FET 77 is at least 45 volts. The rapidly changing capacitance of the FETs at saturation needs to be avoided to help maintain ramp linearity. FET 71 can be a Supertex MOSFET part number VN06F, and FET 77 can be a Teledyne Crystalonics JFET 2N6449 for example. The operational amplifier 67 drives FET 71 so that a 1 milliampere of current flows through resistor 72, causing the difference between the inverting and noninverting inputs to be zero. FET 77 is driven by operational amplifier 75 so that 0.5 milliampere of current flows through resistor 81, causing the voltage difference between the inverting and noninverting terminals to be zero.

Voltage regulator circuit 64 limits the ramp generator to either 250 volts or 500 volts, based on the position of the relay switches 91, all of which are shown in the position used when a high 250 volt gate signal is received and therefore a 250 volt ramp is to be generated. The triangle shaped symbols used in FIGS. 2A and 2B represents a ground connection. The voltage regulator, which comprises a shunt regulator, uses precision resistors in the voltage divider input to the operational amplifier with resistors 93, 95, and 97 having tolerances of 0.005, 0.02, and 0.1%, respectively.

Clamp diode 99 is used to provide a path to sink excess current from the current source when the desired voltage, either 250 v or 500 v is reached. Capacitor 100 has one side connected to the cathode of diode 99 and the other side connected to ground. Capacitor 100 has a value much larger than the range of output capacitance changes exhibited by either FET device during voltage ramping. Capacitor 100 is selected to exhibit stable capacitance when subjected to current, voltage, and temperature changes.

A leakage sense resistor 101 is connected in series with the constant current source output of the ramp generators and provides an isolated voltage drop proportional to the ramp output current. Resistor 101 is preferably of the low capacitance, low inductance, low noise type. Several series connected resistors might be needed to achieve the necessary capabilities. Metal film precision resistors can be used for example. The value of the leakage sense resistor is controlled by the ramp voltage select signal in order to use the same circuitry for measuring the voltage drop for both voltage modes.

A ramp voltage compressor 103 is connected between the diode and the sense resistor in order to reduce the voltage by a factor of 50 to provide a maximum 10 volt analog signal for ramp voltage monitoring. The output signal from the ramp voltage compressor 103 is connected to a ramp voltage comparator circuit 104 and leakage comparator circuit 105. In the ramp voltage comparator circuit the signal is further reduced by a voltage divider circuit 106 and connected to the positive terminal on one comparator and the negative terminal on the other comparator of each of the three pairs of comparators 107 and 109, 111 and 113, and 115 and 117, respectively. The two outputs from each pair of comparators are connected together and through a pull-up resistor 121 to a logic level power supply.

Variable resistors 122A, 122B, 122C, and 122D connected to a precision power supply to provide voltages equal to 5%, 10%, 20%, and 90% of the maximum voltage available from the voltage divider 106, to the comparators. The predetermined voltages are compared to the compressed and divided voltage ramp signal, to provide a high logical level signal to indicate when the ramp is between 10% and 90% at the output of comparator pair 107 and 109, between 10% and 20% at the output of comparator pair 111 and 113, between 0 and 5% at the output of comparator pair 115 and 117. A second ramp voltage compressor 123 is connected to the other side of the sense resistor 101. The ramp voltage compressors 103 and 123 can comprise low voltage 3551 operational amplifiers 112 and 114, respectively from Burr-Brown Research, for example. The input and feedback resistors 112 and 114, respectively for operational amplifiers 104 and 106 are preferably low capacitance, noninductive, precision resistors mounted on a card without internal planes or vias to avoid capacitance effects. Adjacent terminals of the connections of the resistors to the operational amplifier and adjacent terminals of series connected resistors, if needed to achieve voltage operating capabilities, are kept short to avoid adversely influencing ramp linearity. Metal film resistors can be used for example. The voltage compressors 103 and 123 operate as current to voltage convertors with the value of resistors 112 and 114 values selected to be sufficiently large to limit the current flow through the operational amplifier.

The output of the first and second voltage compressors 103 and 123 is supplied to a differential amplifier circuit 128 comprising a differential amplifier 127 which provides the voltage drop across the sense resistor 101. The voltage drop is multiplied by 5 in noninverting amplifier 131. A leakage current of one milliampere will flow through a leakage resistance of 0.5M ohms when the ramp monitor is ramped up to 500 volts. This results in a 100 volt drop across the 100K sense resistor, which when divided by 50 and multiplied by 5 results in a ten volt signal. A 300M Ohm resistance results in a 0.167 volt drop across the sense resistor.

The signals from the ramp compressors are supplied to a psuedo logarithmic analog step adder 133. Three parallel amplifiers 135, 137, and 141 with gains of 0.1, 1, and 10, respectively, each amplify the input signal simultaneously. The amplifiers 135, 137, and 141 are designed so that their output can track the input from zero to one volt. The one volt output will not change no matter how much greater than 1 volt the input level becomes. The three amplifier outputs after being limited, are summed by a three stage analog adder 143A, 143B, and 143C and the output of the adder passed to the positive terminal of one, and the negative terminal of the other, of a pair of comparators 145 and 147. The feedback capacitors 155 shown on the adder stages improves stability, making the operational amplifier less sensitive to extraneous noise and helps avoid overshoot by providing additional positive feedback to slightly slow down the speed of response.

The psuedo logarithmic analog step adder (PLASA) scales each order of magnitude of input voltage from 0.01 to 10 volts so that the entire range falls into a three volt range as shown in the table below. The scaling occurs quickly, on the order of nanoseconds.

| TOTAL RESISTANCE | VOLTAGE ACROSS 100K ohm SENSE RESISTOR | INPUT TO PLASA | OUTPUT from PLASA |
|---|---|---|---|
| .5M ohms | 100 volts | 10 volts | 3.000 v |
| 5M ohms | 10 volts | 1 volts | 2.100 v |
| 50M ohms | 1 volts | .1 volts | 1.110 v |
| 300M ohms | .167 volts | .0167 volts | 0.185 v |
| 500M ohms | .1 volts | .01 volts | 0.111 v |

Variable resistors 151A and 151B connected to a precision power supply provide two voltages which are compared to the output of the psuedo logarithmic analog step adder. Resistor 151A is connected to the negative terminal of comparator 145 and the output of the psuedo logarithmic step adder is provided to the positive terminal of comparator 145, to provide a voltage proportional to the minimum leakage current detectable, which is associated with 300M ohm resistance. Resistor 151B is connected to the positive terminal and the output of the psuedo logarithmic step adder is connected to the negative terminal of comparator 147 to provide a voltage proportional to the maximum leakage current detectable which is associated with a 500K ohm total resistance. The output of the two comparators are connected together and through a pull-up resistor 153 to a logic level power supply. The output of the comparators provides a detection window indicative of a leakage current between the minimum and maximum value detectable with the leakage signal high.

Referring again to FIG. 2B, the ramp 0-5% signal from comparators 115 and 117, which is high when the ramp is between 0-5% is connected through an inverter 157 to the clock input of the 5% latch 35 and provides the 5% ramp level signal to the DI/DO interface 23.

The 5% latch 35 is no longer held in the reset condition when the test enable line 25 goes high. The $\overline{Q}$ output of the 5% latch 35, however, is still high and connected to the gate of the latch. When the 0-5% ramp signal goes low, indicative of the ramp being at or greater than 5%, the inverted signal provides a positive edge to the clock of the 5% latch 35 causing the Q output to go high, providing the 5% ramp latch signal to the DI/DO interface 23. The ramp 10-90% signal from the comparators 107 and 109 is high when the ramp voltage is between 10 and 90%. The ramp 10-90% signal is connected to a gate on a 16 bit up counter 161 which is clocked by 64 MHz timer 163 connected to the clock input port on the counter 161. After being inverted in inverter 164, the 10-90% signal is connected to a variable delay timer circuit 173 and to the clock input of the 90% latch 33.

The variable delay timer circuit 173 provides a delay dependent on the length of time it takes for the ramp to go from 10% to 90% of its value, with a longer ramp time resulting in a longer delay. The delay is determined by an RC time constant, the characteristics of which can be changed by adjusting variable resistors 167 and 171 and is adjusted to achieve an adequate delay time after the voltage ramps to the desired value and is clamped by diode 99 and after the reactive phase shift caused by the resistance in the ramp circuit settles down. The variable delay circuit 173 receives the inverted 10-90% ramp signal through a resistor 175 connected to the base of an NPN transistor 177 which has its emitter grounded and serves as an amplifier. The amplified signal is supplied to a series connected capacitor 181 and variable resistor 171 to ground. A constant voltage source 183 provides a voltage through variable resistor 167 to the positive input of a comparator 185. The constant voltage source 183 is also connected through a resistor 187 to the collector of transistor 177. The collector of the transistor 177 is connected through a resistor 191 to the base of NPN transistor 193. The collector of transistor 193 is connected between resistors 167 and 187. While the ramp goes from 10-90%, an input signal is received by the variable delay timer. The inverting input of the comparator 185 increases to a value more than the fixed noninverting voltage. The length of time the 10-90% ramp signal is received determines the charge on capacitor 181 and how long until the voltage at the inverting input drops below the noninverting terminal voltage, causing the variable delay timer to provide a positive going edge at its output.

The isolated signal from the emitter of transistor 193 is connected to the negative input of voltage comparator 185 and to ground through a resistor 145. The output of the voltage comparator provides the delayed pulse. The 10-20% ramp level signal from comparators 111 and 113 is connected to the gate of a 15 bit up counter 200. The counter 200 is clocked by the 64 MHz clock 163.

When the ramp 10-90% signal goes low, the clock input of 90% latch 35 receives a positive going edge gating the latch and thereby causing the Q output to go high, which clocks a 1 millisecond single shot timer 197 and a 10 millisecond single shot timer 201. The dwell select line 203 from the DI/DO interface is connected to the gate on the 10 millisecond single shot timer 201 and is connected through an inverter 205 to the gate of the 1 millisecond single shot timer 197. The single shot timer selected by having its gate held high when the 90% latch sets provides, a pulse to one input of OR gate 51 keeping the previously selected AND gate either 45 or 47 enabled. The Q output of the 90% latch is also connected to the DI/DO interface 23 providing the 90% ramp latch input and is further connected to a single shot timer 207 which provides a one microsecond pulse. The one microsecond pulse is connected to the clock input of the 15 bit latch 43 and 16 bit latch 41. The counter select signal line 207 from the DI/DO interface 23 is connected to the gate out control input of register 43 and to an inverter 211. The output of inverter 211 is connected to the gate out control input of 16 bit register 41.

The output of the one microsecond single shot 207 is inverted in inverter 213 and connected to clock the leakage enable latch 215. The inverted test enable signal line 25 is connected to the reset port of the leakage enable latch 215. The $\overline{Q}$ output latch 215 is connected to its gate input. The trailing edge of the inverted pulse of the test enable signal provides the positive transition pulse which changes the $\overline{Q}$ output low. The $\overline{Q}$ output of the leakage enable latch 215 is connected to the reset inputs of initial leakage latch 217 and dwell leakage latch 221. When the $\overline{Q}$ output of leakage enable latch 215 goes low, the latches 217, 221, and 223 are no longer held in their reset condition.

The output pulse from the variable delay timer 173 is connected to the clock input of initial leakage latch 217 and the gate input of dwell leakage latch 223. The leakage signal line from the comparators 145 and 147 of FIG. 2A, indicative of leakage between an upper and lower limit when the line is high, is connected to the gate of initial leakage latch 217 and to the clock input of dwell leakage latch 221. Leakage detected when the variable delay pulse begins is detected by latch 217. Any leakage that occurs after the pulse from the variable delay timer circuit 173 has begun is detected by latch 221. The Q output of latches 221 and 217 are combined in OR gate 225 and the output of the OR gate is used to clock latch 223. The $\overline{Q}$ output of latch 223 is connected to its gate input. Detection of leakage causing the transition of the Q output of either latch 217 or latch 221 to go high results in the Q output of latch 223 also going high. The Q output of latch 223 is connected to one input of a two input AND gate 227 and the counter select line from the DI/DO interface is connected to the other input of AND gate 227 so that the leakage bit and the 15 bit register contents are transferred to a parity generator 231 at the same time.

In operation, information concerning the substrate or board to be tested is transferred to the programmable controller 21 of FIG. 1 from the host computer. The information includes the voltage at which the test is to be run and the dwell time of either 1 or 10 milliseconds after the 90% ramp voltage level has been reached. The dwell time determines the voltage stress to be applied. The ramp voltage and dwell time depend on the board or substrate to be tested, taking into account spacing between adjacent nets and the thickness and strength of the dielectric materials.

Capacitance is measured by providing a constant charging current from the high voltage ramp monitor to the shorted together voltage and ground planes of the board being tested while the net being tested is grounded. A capacitive net without leakage to the ground or power planes, or to other nets, will have a linear voltage rise proportional to capacitance between the net and the ground and voltage planes. The capacitance can be determined from the ramp time provided by the high voltage ramp monitor to the programmable controller. A net to net short will result in greater than expected ramp time measurement. Net to net leakage will be detected as residual charge current in the leakage output latch. A net to internal plane short will be detected by charge current limiting preventing an increase in voltage on the net. Net to internal plane leakage will be detected by leakage output latch which is monitored by the programmable controller. Short/open detection is performed by comparing measured net capacitance to nominal net capacitance. The nominal net capacitance can be calculated based on artwork design data and capacitance coefficients of the basic shapes used. Capacitance coefficients are derived from finite element capacitance models for a particular technology. Such data is consistent, although it may be offset due to modelling errors. Alternatively the nominal net capacitance can be based on one or more defect free, random samples for every part number to be tested.

Calibration of the high voltage ramp monitor needs to be performed before board or substrate testing can begin. A null capacitance measurement at the dielectric surface of the board or substrate to be tested is needed to compensate for the distributed capacitance of the high voltage ramp monitor and probes as well as the distributed capacitance of the product under test to its environment. The moveable test probes 15 are placed in contact with the dielectric surface of the board or substrate to be tested. The fixed power probe 7 is connected to the shorted together power and ground planes. The test sequence is shown in the flow chart of FIG. 3.

Figure 3:
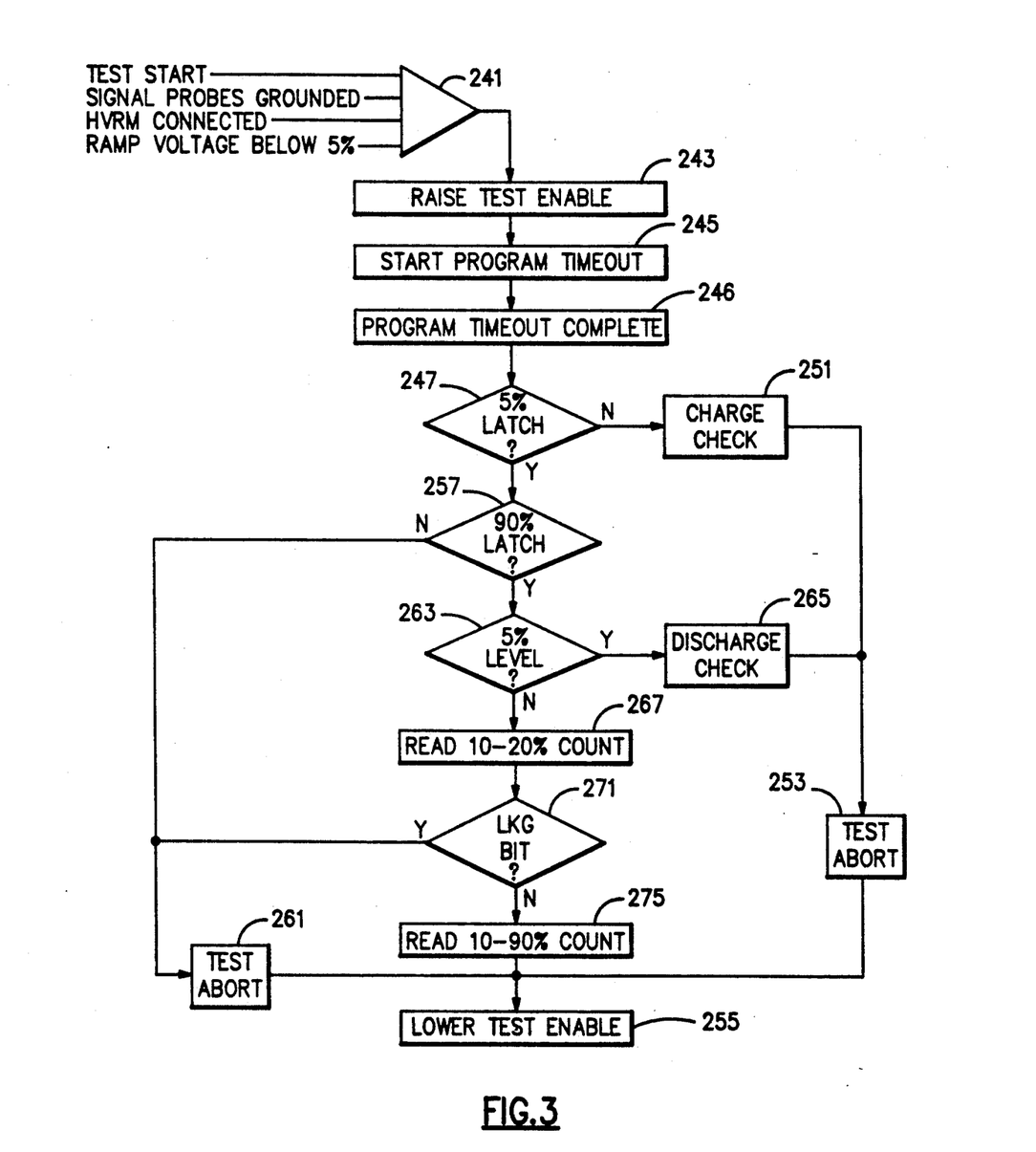
FIG. 3 is a flow chart showing the steps used in calibrating the high voltage ramp monitor.

In order to start a test, a start signal needs to be raised by the programmable controller, the signal probes must be grounded, the high voltage ramp monitor must be connected to the board or substrate to be tested, and the ramp voltage must be below 5%. This is checked in AND block 241. The ramp 0–5% signal line connected from the high voltage ramp monitor through the DI/DO interface to the programmable controller is checked to see that the signal line is high, indicative that any previous charge in the high voltage ramp monitor has discharged, with the ramp 0–5% signal high. When the four items connected to the AND block are true, the test enable signal supplied to the high voltage ramp monitor is raised in block 243.

A start program timeout is begun in block 245 of either 2 or 20 milliseconds by the programmable controller, depending on whether a 1 or 10 millisecond dwell is used during the test. The program timeout is long enough to allow the test to be completed.

Before the program timeout is begun, the test enable, ramp voltage select and dwell select signals are sent to the high voltage ramp monitor from the programmable controller in block 243, the constant current source selected provides a constant current which charges up the net which is grounded by the probes. When the ramp voltage reaches 5%, the 5% ramp latch is set and the 5% ramp level signal and the 5% ramp latch transition high with these lines connected through the DI/DO interface to the programmable controller. The 5% ramp level signal is indicative of whether the ramp voltage is above or below 5% at the present time. The 5% ramp latch is indicative of whether or not the ramp voltage ever reached 5% since the time the latch was last reset. The programmable controller checks that the 5% latch is set in decision block 247 after the timeout is completed.

Figure 6:
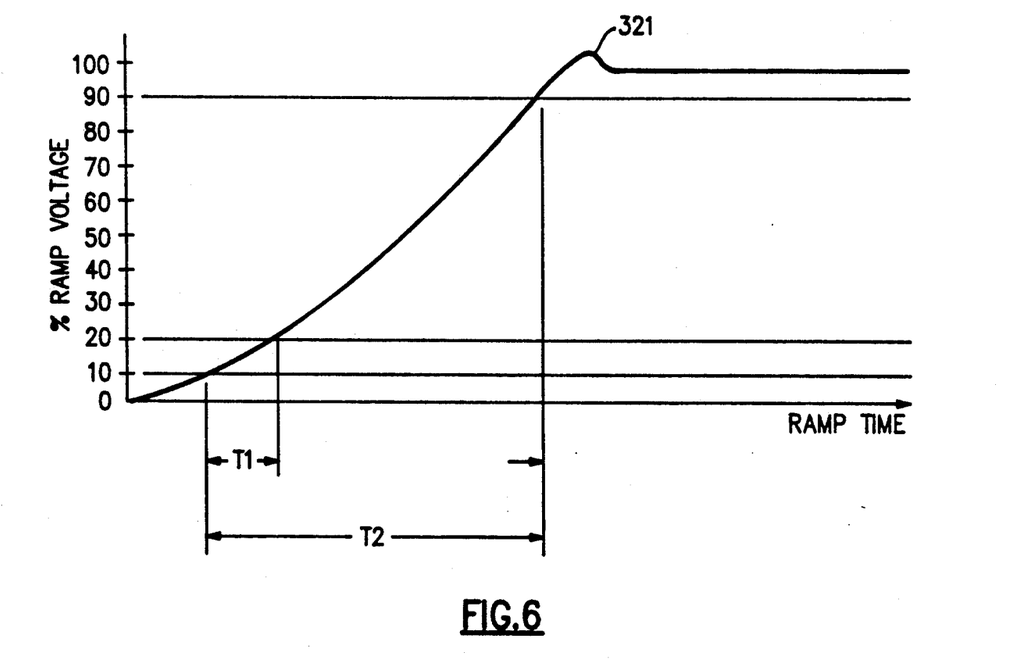
FIG. 6 is a graph showing ramp voltage as a function of time to illustrate RC settling phase shift at the end of the ramp which is not seen on a direct voltage display of an oscilloscope.

When the 5% latch is set, the output of the ramp 10–20% comparator pair starts the 15 bit counter when the ramp voltage reaches 10% and stops the counter when the ramp reaches 20%. The ramp 10–90% comparator pair starts the 16 bit counter when the ramp reaches 10% and stops the counter when the ramp reaches 90%. Upon reaching 90% of the ramp voltage, the preselected 1 or 10 millisecond dwell begins and the variable delay circuit provides a delay based on the time it took the 10–90% voltage ramp to occur. The variable delay should be sufficient to allow any reactive phase shift to settle before the delayed pulse begins. The effect of reactive settling currents at the end of the ramp due to the RC components of the circuit under test is shown in FIG. 6 indicated by reference numeral 321. Time T1 and T2 are the times for the 10–20% and 10–90% voltage ramps to occur, respectively. The initial leakage latch 217 determines if there is any leakage when the variable delay first provides a high output. The dwell leakage latch detects any leakage after the variable delay circuit provides a high output and before the counter 200 is read. If any leakage is detected a leakage bit is set and included with the count from the 15 bit latch through the RC time constant of the monitor.

When the program timeout is complete in block 246, the 5% latch is checked in decision block 247 to see if it has set. If 5% latch has not set, a charge check message is stored in block 251, the test aborted in block 253 and the test enable line lowered in block 255. If the 90% latch has not set, as determined in decision block 257, the test is aborted in block 261. If the 90% latch is set, the programmable controller checks the 0–5% ramp level line in decision block 263 to see if the ramp voltage has dropped below 5%. If it has, the signal 0–5% ramp level line is high. If the signal is low, then the voltage has not discharged through the RC time constant of the circuit, and a discharge check error message is recorded by the programmable controller in block 265. If the voltage has dropped to or below 5%, then the 10–20% counter is read in block 267. Next, the leakage bit is checked in decision block 271. If the leakage bit is low, indicating no leakage, then the 10–90% counter provides a measure of the null count which is saved in block 275. The test enable signal is lowered in block 255. Repeating the test five times and averaging the results improves the accuracy of the null count measurement.

Figure 4:
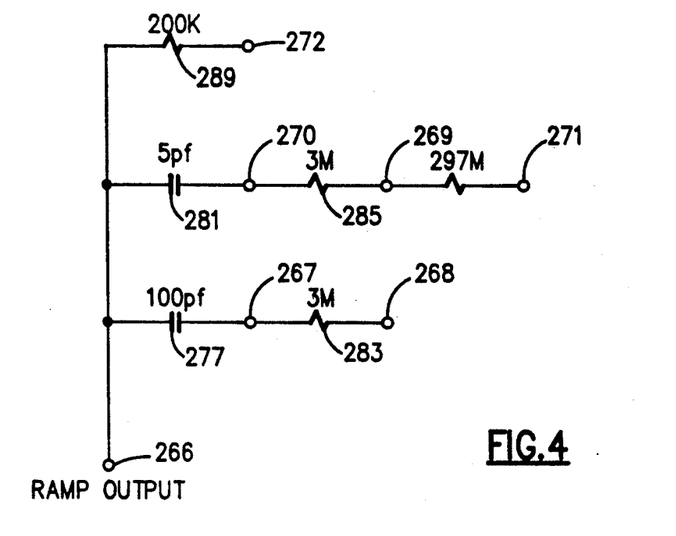
FIG. 4 is a detailed schematic diagram of the test block shown in FIG. 1.

The test block 17 of FIG. 1, which is shown in more detail schematically in FIG. 4, is used in determining the high and low scaling factors used in determining capacitance and for simulating resistive shorts and leakage paths for diagnostic purposes. The test block has seven touch pads 266, 267, 268, 269, 270, 271, and 272 which can be contacted by the movable signal probes. Touch pad 266 of the circuit is connected to the fixed power probe 7. Connected between touch pad 267 and touch pad 266 is a capacitor 277 close to the high end of expected values such as 100 pF. Connected between touch pad 270 and touch pad 266 is a capacitor 281 close to the low end of expected values such as 5 pF. Connected between touch pad 268 and touch pad 266 is a resistor 283 having a value of resistance such as 3M in series with capacitor 277. Connected between touch pad 269 and touch pad 266 is a resistor 285 having a value of resistance such as 3M in series with capacitor 281. Between touch pad 271 and touch pad 266 is a series combination of capacitor 281, resistor 285 and a large resistor such as 297M resistor. Connected in series between touch pad 272 and touch pad 266 is a small resistor 289 having a value such as 200 k.

To determine the low scaling factor, one of the movable probes is placed in contact with touch pad 270. The steps in the flow chart of FIG. 3, as previously described, are performed with the reading of the 10-90% counter saved, the null count previously determined subtracted and the value of capacitor 281, 5 pF, is divided by the resulting count. The result is in terms of pF per count. The test is performed several times, five for example, and the results saved.

To determine the high scaling factor, one of the movable probes is placed in contact with touch pad 267. The steps in the flow chart in FIG. 3 are again performed. The count from the 10-90% counter is stored and the null count subtracted from it. The value of capacitor 277, 100 pF, is divided by the resulting count and the result saved. After several readings, five for example, have been obtained the average of the pF per count for the large and small capacitors is saved as the scaling factor. The use of capacitor 100 which is in parallel with the capacitance to be measured allows the ramps generated to track more linearly for different values of capacitance measured allowing a single scaling factor to be used. The value of capacitor 100 is chosen to mask the variable capacitance effects exhibited by the field effect transistor, voltage regulator and clamp as well as other reactive components in the circuit. The capacitance in the circuit without capacitor 100 is about 40 picoFarads which varies with voltage and temperature. The stabilizing effect of capacitor 100 which can have a value of 100 picoFarads and varies very little with voltage and temperature allows ramp length to vary linearly plus or minus 5% with the values of capacitance to be measured which are placed in parallel with capacitor 100. Capacitor 100 is selected to be highly stable over time and temperature changes. PTFE film capacitor can be used, for example.

Figure 5:
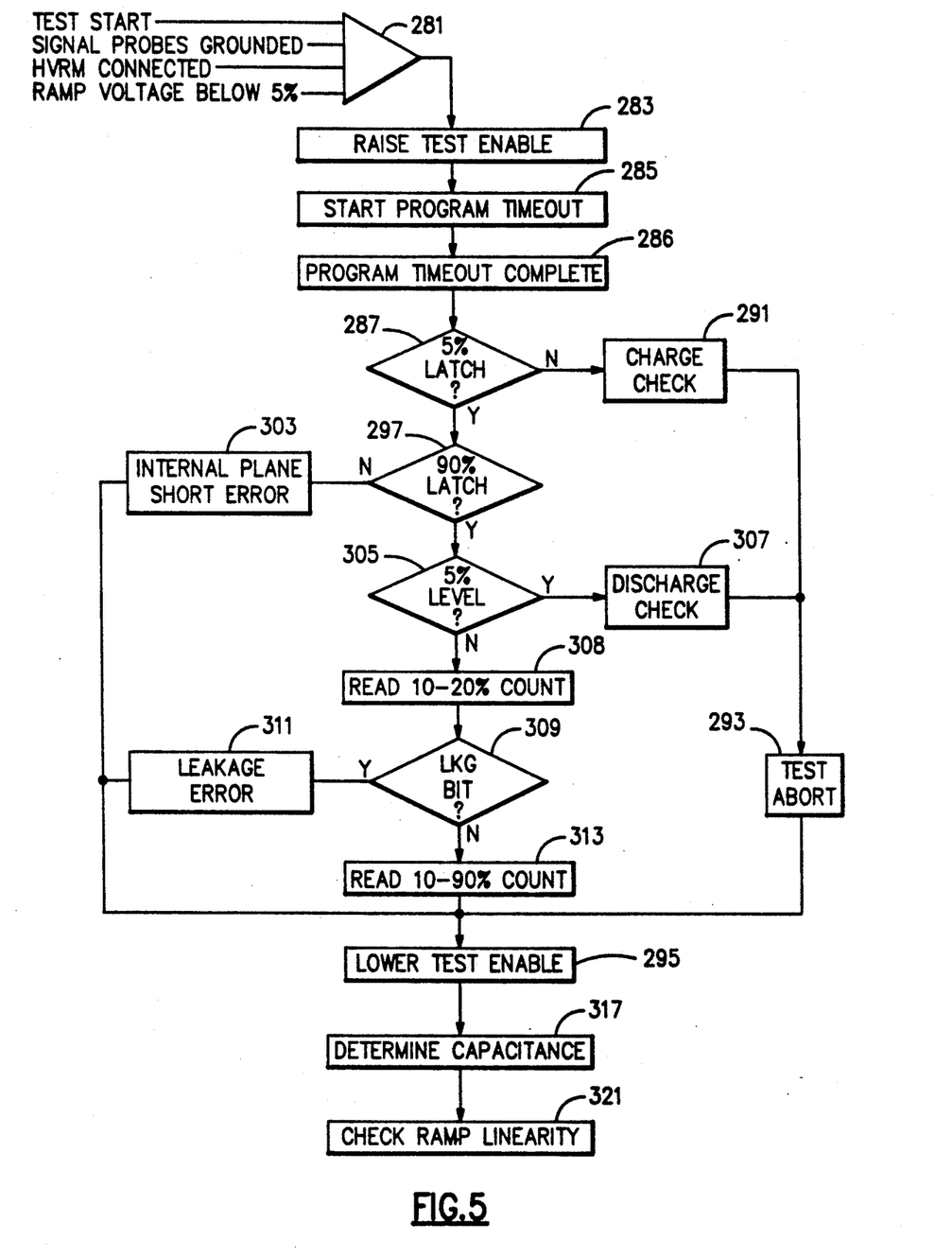
FIG. 5 is a flow chart showing the steps used in determining capacitance and leakage in a net being probed.

Once the calibration has been performed, the capacitance of the nets on an unpopulated board or substrate can be tested. The flow chart of FIG. 5 shows the interaction between the programmable controller and the high voltage ramp monitor. The host computer provides the voltage select and dwell select for the substrate or board to be tested. The position of the movable probes is set by a robotic handler. One or two probes can be used. In order to start a test, a start signal needs to be raised by the programmable controller, the signal probes grounded, the high voltage ramp monitor connected to the board or substrate to be tested, and the ramp voltage below 5%. This is checked in AND block 281. When the four items connected to the AND block are true, the test enable signal supplied to the high voltage ramp monitor is raised in block 283.

A start program timeout is begun in block 285 of either 2 or 20 milliseconds by the programmable controller, depending on whether a 1 or 10 millisecond dwell is used during the test. The program timeout is long enough to allow the test to be completed. If one movable probe is used, it is positioned at one end of a net being checked grounding that end. A single probe is used when checking for an open in a net. When two probes are used they ground both ends of the net being checked for a short to another net or a short to the power or ground plane.

During the program timeout, the test enable, ramp voltage select and dwell select signals are sent to the high voltage ramp monitor from the programmable controller in block 283. The constant current source selected provides a constant current which charges up the net which is grounded by the probes. When the ramp voltage reaches 5%, the 5% ramp latch is set and the 5% ramp level signal and the 5% ramp latch transition high, with these lines connected through the DI/DO interface to the programmable controller. The 5% ramp level signal is indicative of whether the ramp voltage is above or below 5% at the present time. The 5% ramp latch is indicative of whether or not the ramp voltage ever reached 5% since the time the latch was last reset. The programmable controller checks that the 5% latch is set in decision block 287 after the timeout is completed.

When the 5% latch is set, the output from the ramp 10-20% comparator pair starts the 15 bit counter when the ramp voltage reaches 10% and stops the counter when the ramp voltage reaches 20%. The ramp 10-90% comparator pair starts the 16 bit counter when the ramp reaches 10% and stops the counter when the ramp reaches 90%. Upon reaching 90% of the ramp voltage, the preselected 1 or 10 millisecond dwell begins and the variable delay circuit provides a delay based on the time it took the 10-90% voltage ramp to occur. The variable delay should be sufficient to allow any ramp overshoot and ringing to settle before the delayed pulse begins. The delayed pulse should continue at least until the 10 millisecond dwell provided by timer 201. The initial leakage latch 217 determines if there is any leakage when the variable delay first provides a high output. The dwell leakage latch detects any leakage after the variable delay circuit provides a high output and before the counter 200 is read. If any leakage is detected a leakage bit is set and included with the count from the 15 bit latch through the RC time constant of the monitor. The above description is described in terms of what would be viewed on an oscilloscope display showing both currents and voltages and taking into account the reactive elements in the circuit under test.

When the program timeout is complete in block 286, the 5% latch is checked in decision block 287 to see if it has set. If 5% latch has not set, a charge check message is stored in block 291, the test aborted in block 293 and the test enable line lowered in block 295. The 90% latch is checked in block 297. If the 90% latch is not set, the condition is recorded as a power plane or ground plane short error in block 303 and the test enable signal is lowered in block 295. If the 90% latch is set, the 0-5% voltage level is again checked in block 305 to determine whether the ramp voltage which is no longer being applied has discharged below 5%. If the RC time constant of the high voltage ramp monitor has not discharged the ramp voltage before the end of the 2 or 20 millisecond, timeout a discharge error is recorded in block 307, the test is aborted and the test enable signal lowered in block 295. If the voltage has fallen below 5% as determined in decision block 305 then the counter select signal is set high and the 10-20% counter signal together with the leakage bit is sent via the data bus to the programmable controller in block 308. The leakage bit is checked in decision block 309. If the leakage bit is set then a leakage error is recorded in block 311 and the test enable signal lowered in block 295. A leakage error can occur when a net to net failure occurs because of a resistive path between the nets. If the leakage bit was not set, then the 10-90% counter is read in block 313 and the test enable signal lowered in block 295. The capacitance is determined by subtracting the null count from the 10–90% counter and multiplying by the scaling factor in block 317.

Large values of resistance can be uncovered due to the leakage bit being set. If the resistance is small the fault condition can be determined by the larger than expected value of capacitance measured.

To uncover an open net condition, one movable probe is positioned at one end of the net to be checked and the measurement made. A movable probe is then positioned at the other end and the measurements again made. A comparison of the resulting capacitance measurements to the expected value of capacitance is made. The net would be considered open if either measured value of capacitance was less than the expected value.

The foregoing has described a capacitance and leakage test apparatus which provides a voltage stress test while measuring capacitance and which also detects high resistance leakage paths between nets.

While the invention has been particularly shown and described with reference to one embodiment thereof, it will be understood by those skilled in the art that various changes in form and detail may be made without departing from the spirit and scope of the invention.

What is claimed is:

1. Apparatus for checking a net on a circuit board or substrate separated by a dielectric from a plane of electrically conductive material, comprising:
    current source means connectable to one, and grounding means connectable to the other, of the net and the plane, for ramping up and maintaining a voltage therebetween;
    means for measuring the voltage between the net and the plane;
    means for measuring the time required for the voltage across the net and the plane, to increase a predetermined amount when being charged by said current source means;
    means for limiting and maintaining the voltage across the plane and net to a predetermined limit value; and
    means for monitoring the current supplied by said current source for maintaining the voltage at the predetermined limit value, so that current supplied after the limiting voltage is reached is indicative of leakage to another net.

2. The apparatus of claim 1, wherein said current source means comprises a field effect transistor and power supply means, said power supply means selected so that the voltage between the drain and source of said field effect transistor is at least 10% of the full rated drain voltage during operation.

3. The apparatus of claim 1, further comprising capacitor means in parallel with said net being checked and said plane.

4. The apparatus of claim 3, wherein said capacitor means comprises a discrete capacitor.

5. The apparatus of claim 1, further comprising means coupled to said means for measuring time for determining the capacitance between said net being checked and said plane.

6. The apparatus of claim 5, further comprising capacitor means, in parallel with said net being checked and said plane, for providing voltage ramp slopes between the net being checked and the plane linearly proportional to the capacitance to be measured.

7. The apparatus of claim 6, wherein said capacitor means comprises a discrete capacitor having a value sufficient to make ramp length vary linearly within a desired tolerance with the value of capacitance being measured between said net to be checked and said plane.

8. The apparatus of claim 1, wherein said means for limiting and maintaining the voltage comprises a voltage regulator coupled through a diode to said current source means.

9. The apparatus of claim 1, wherein said means for measuring the voltage comprises a sense resistor in series with said current source, and voltage compressor circuit means coupled to either side of said sense resistor.

10. The apparatus of claim 1, wherein said means for monitoring the current supplied comprises means, coupled to said means for measuring the time, for providing a delay, which is a function of the time for the voltage to increase a predetermined amount, before monitoring the current supplied by said current source.

11. Apparatus for measuring capacitance between a net and a plane, and for checking for a short between the net and the plane, comprising:
    current source means connected to one, and ground means connected to the other, of the net and the plane, for increasing the voltage therebetween;
    means for measuring the voltage between the net and the plane;
    means for determining whether a predetermined voltage across the plane and net charged by said current source means is reached in less than a predetermined time, so that failure to reach said predetermined voltage in less than said predetermined time is indicative of a short between the net and plane; and
    means for measuring the time required for the voltage across the net and plane charged by said current source to reach a predetermined voltage value, said time to reach said predetermined voltage value being indicative of the capacitance of said net.

12. The apparatus of claim 11, wherein said current source means comprises a field effect transistor and power supply means, said power supply means selected so that the voltage between the drain and source of said field effect transistor is at least 10% of the full rated drain voltage during operation.

13. The apparatus of claim 11, further comprising capacitor means in parallel with said net and said plane.

14. The apparatus of claim 13, wherein said capacitor means comprises a discrete capacitor.

15. The apparatus of claim 11, further comprising means coupled to said means for measuring time for determining the capacitance between said net being checked and said plane.

16. The apparatus of claim 15, further comprising capacitor means, in parallel with said net and said plane, for providing voltage ramp slopes between the net and the plane linearly proportional to the capacitance to be measured.

17. The apparatus of claim 16, wherein said capacitor means comprises a discrete capacitor having a value sufficient to make ramp length vary linearly within a desired tolerance with the value of capacitance being measured between said net to be checked and said plane.

18. The apparatus of claim 11, wherein said means for measuring the voltage comprises a sense resistor in series with said current source, and voltage compressor circuit means coupled to either side of said sense resistor.

19. A method of checking a net separated by a dielectric from a plane of electrically conductive material, comprising the steps of:
   supplying a current to one, and grounding the other, of the net and the plane, for providing an increasing ramp and maintaining a constant voltage therebetween;
   measuring the time required for the voltage across the plane and net to reach a predetermined value;
   limiting the voltage across the plane and net to a predetermined limit value;
   monitoring the amount of current supplied to maintain the voltage at the predetermined limit; and
   recording a leakage condition to another net when said current supplied after the limiting voltage is reached is greater than a predetermined value.

20. A method of checking nets on printed circuit boards and substrates separated by a dielectric from a plane of electrically conductive material, comprising the steps of:
   supplying a current to one, and grounding the other, of the net being checked and the plane, for increasing the voltage therebetween;
   determining whether a first predetermined voltage across the plane and the net being checked is reached before the expiration of a predetermined time period;
   recording a short between the plane and the net being checked when the voltage is not reached before said time period expiration;
   measuring the time required for the voltage across the net and plane being checked to reach a second predetermined value; and
   determining the capacitance between the plane and the net being checked from the time required to reach the second predetermined value.

21. The apparatus of claim 1, wherein said current source is connectable to the plane of electrically conductive material and said grounding means is connectable to said net.

22. The apparatus of claim 11, wherein said current source is connectable to the plane of electrically conductive material and said grounding means is connectable to said net.

23. Apparatus for simultaneously measuring resistance and capacitance of a net on a circuit board or substrate separated by a dielectric from a plane of electrically conductive material comprising:
   a sense resistor;
   current source means connected in series with said sense resistor, the current source means connectable through said sense resistor to one, and grounding means connectable to the other, of the net and the plane, for ramping up and maintaining a voltage therebetween;
   means for measuring the voltage between the net and the plane;
   means for measuring the time required for the voltage across the net and the plane to increase a predetermined amount when being charged by said current source means, so that the capacitance between the net and the plane of electrically conductive material can be determined;
   means for limiting and maintaining the voltage across the plane and net to a predetermined limit value; and
   means for measuring the voltage across said sense resistor for monitoring the current supplied by said current source for maintaining the voltage across said net at the predetermined limit value, so that leakage current supplied after the limiting voltage is reached can be detected.

24. The apparatus of claim 23, wherein said means for measuring the voltage across said sense resistor further comprises means for measuring static and dynamic changes of the voltage across the sense resistor for detecting leakage paths between the net and the plane of conductive material and for detecting leakage paths to circuit board nets not under test, respectively.

* * * * *